US009837474B2

(12) United States Patent
Park

(10) Patent No.: US 9,837,474 B2
(45) Date of Patent: Dec. 5, 2017

(54) ORGANIC LIGHT EMITTING DIODE DISPLAY

(71) Applicant: SAMSUNG DISPLAY CO., LTD., Yongin-si, Gyeonggi-do (KR)

(72) Inventor: Kyung Min Park, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/977,592

(22) Filed: Dec. 21, 2015

(65) Prior Publication Data

US 2016/0204172 A1 Jul. 14, 2016

(30) Foreign Application Priority Data

Jan. 9, 2015 (KR) .................. 10-2015-0003529

(51) Int. Cl.
*H01L 27/32* (2006.01)
*H01L 51/50* (2006.01)
*H01L 27/12* (2006.01)

(52) U.S. Cl.
CPC ...... *H01L 27/3248* (2013.01); *H01L 27/3223* (2013.01); *H01L 27/3258* (2013.01); *H01L 27/3262* (2013.01); *H01L 51/50* (2013.01); *H01L 27/124* (2013.01); *H01L 27/1233* (2013.01); *H01L 27/1248* (2013.01)

(58) Field of Classification Search
CPC ............. H01L 27/3223; H01L 27/3248; H01L 27/3258; H01L 27/3262; H01L 51/50
See application file for complete search history.

(56) References Cited

U.S. PATENT DOCUMENTS

| 8,785,940 | B2 * | 7/2014 | Kim ..................... H01L 27/3223 257/40 |
| 9,129,923 | B1 * | 9/2015 | Han ..................... H01L 27/3248 |
| 2010/0255619 | A1 * | 10/2010 | Kwon ................. H01L 27/1255 438/34 |
| 2012/0292621 | A1 * | 11/2012 | Kim ..................... H01L 27/3223 257/59 |
| 2013/0181203 | A1 * | 7/2013 | Yamazaki ........... H01L 51/0097 257/40 |
| 2014/0299842 | A1 * | 10/2014 | Kim .................. H01L 29/78678 257/40 |

FOREIGN PATENT DOCUMENTS

| JP | 4520226 B2 | 8/2010 |
| KR | 10-0611158 B1 | 8/2006 |
| KR | 10-2012-0092994 A | 8/2012 |
| KR | 10-1303816 B1 | 9/2013 |

* cited by examiner

*Primary Examiner* — Allan R Wilson
(74) *Attorney, Agent, or Firm* — Lewis Roca Rothgerber Christie LLP

(57) ABSTRACT

An organic light emitting diode display includes a substrate including a display area and a non-display area adjacent the display area, a plurality of organic light emitting diodes at the display area of the substrate, a plurality of thin film transistors at the display area of the substrate, each of the plurality of thin film transistors being connected to a corresponding one of the plurality of organic light emitting diodes, and a first insulating layer covering an active layer of the plurality of thin film transistors, the first insulating layer having a greater number of contact holes at an outer region of the display area than at a central area of the display area.

10 Claims, 9 Drawing Sheets

ORGANIC LIGHT EMITTING DIODE DISPLAY

CROSS-REFERENCE TO RELATED APPLICATION

This application claims priority to and the benefit of Korean Patent Application No. 10-2015-0003529 filed in the Korean Intellectual Property Office on Jan. 9, 2015, the entire contents of which are incorporated herein by reference.

BACKGROUND

1. Field

The present invention relates to an organic light emitting diode display, and more particularly, to an organic light emitting diode display including a plurality of thin film transistors and a plurality of organic light emitting diodes connected thereto.

2. Description of the Related Art

Generally, as a representative example of a flat panel display, there are an organic light emitting diode display, a liquid crystal display, a plasma display panel, and the like.

Among these, the organic light emitting diode display includes a plurality of thin film transistors and a plurality of organic light emitting diodes which are formed on a substrate.

In a typical organic light emitting diode display, a plurality of thin film transistors are manufactured over the substrate by a MEMS technology such as a photolithography process.

The above information disclosed in this Background section is only for enhancement of understanding of the background of the invention and therefore it may contain information that does not form a prior art.

SUMMARY

The embodiments of the present invention have been made in an effort to provide an organic light emitting diode display that is capable of suppressing a difference among current values supplied to a plurality of organic light emitting diodes from occurring over a substrate even though a difference among widths of active layers of a plurality of thin film transistors, inadvertently occurs over the substrate.

According to an aspect of an embodiment, an organic light emitting diode display may include: a substrate including a display area and a non-display area adjacent the display area; a plurality of organic light emitting diodes at the display area of the substrate; a plurality of thin film transistors at the display area of the substrate, each of the plurality of thin film transistors being connected to a corresponding one of the plurality of organic light emitting diodes; and a first insulating layer covering an active layer of the plurality of thin film transistors, the first insulating layer having a greater number of contact holes at an outer region of the display area than at a central area of the display area.

The first insulating layer may contact the active layer.

The plurality of thin film transistors includes a central thin film transistor at a central area of the display area and an outer thin film transistor at an outer region of the display area, and a width of the active layer of the outer thin film transistor may be greater than a width of the active layer of the central thin film transistor.

The contact holes may include at least one dummy contact hole.

The dummy contact hole may overlap the active layer.

The dummy contact hole may not overlap the active layer.

The organic light emitting diode display may further include: a second insulating layer covering the first insulating layer, wherein the second insulating layer may be inside of the dummy contact hole.

The organic light emitting diode display may further include: a plurality of data lines extending in one direction on the substrate and connected to the plurality of thin film transistors, and a data driver at the non-display area of the substrate and connected to the plurality of data lines, wherein the outer region may be adjacent the data driver.

The active layer may be heat treated in a state in which the active layer is covered with the first insulating layer.

The active layer may further include a channel region, the channel region being bent at least once.

DETAILED DESCRIPTION

Figure 1:
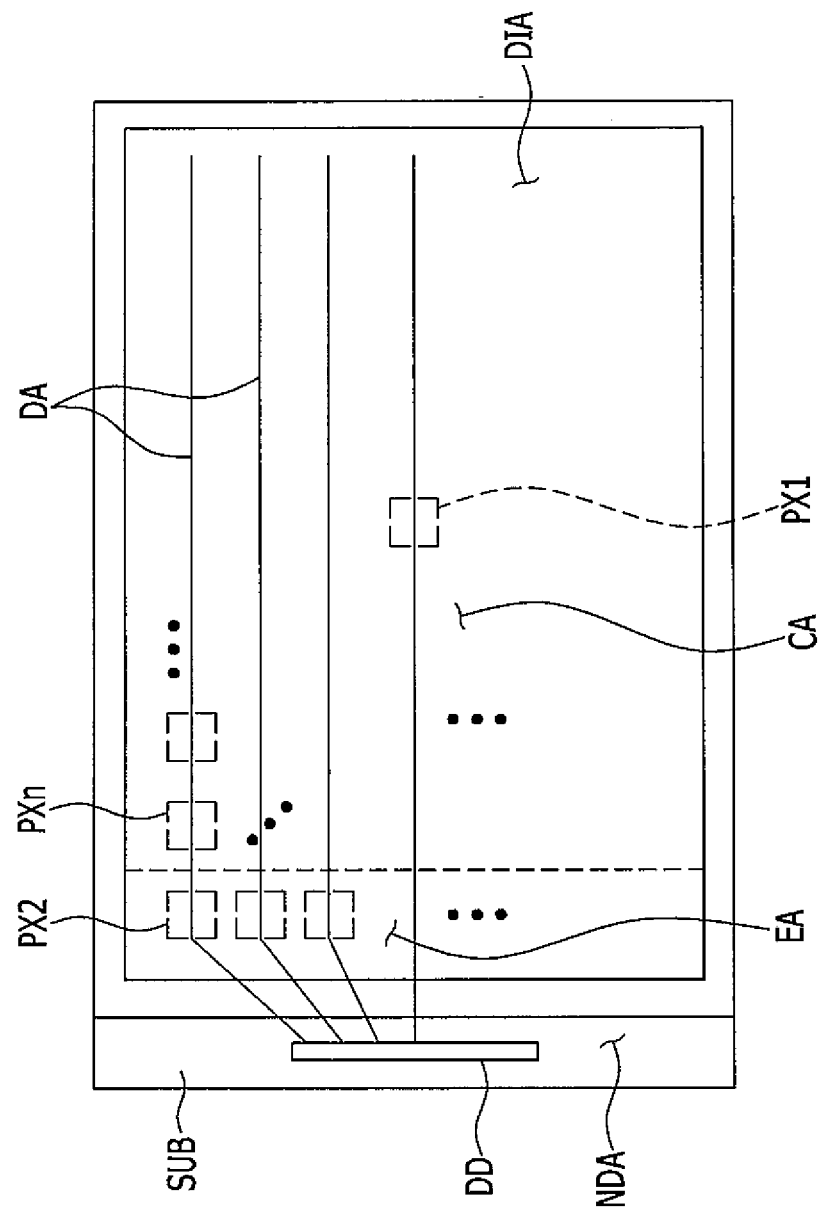
FIG. 1 is a plan view schematically illustrating an organic light emitting diode display according to an exemplary embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and components and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or the like. Further, the various components of these devices may be a process or thread, running on one or more processors, in one or more computing devices, executing computer program instructions and interacting with other system components for performing the various functionalities described herein. The computer program instructions may be stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, an organic light emitting diode display according to an exemplary embodiment of the present invention will be described with reference to FIGS. 1 to 7.

FIG. 1 is a plan view schematically illustrating an organic light emitting diode display according to an exemplary embodiment of the present invention. Hereinafter, a pixel refers to a minimum unit (or a smallest unit) for displaying an image As illustrated in FIG. 1, an organic light emitting diode display according to an exemplary embodiment of the present invention includes a substrate SUB, a plurality of pixels PXns, a plurality of data lines DAs, and data drivers DDs.

The substrate SUB includes a display area DIA for displaying an image and a non-display area NDA which is adjacent to the display area DIA. The non-display area NDA may be positioned to surround a periphery of the display area DIA. The substrate SUB may be an insulating substrate including glass, polymer, stainless steel, and/or the like. The substrate SUB may be flexible, stretchable, foldable, bendable, and/or rollable. The substrate SUB is flexible, stretchable, foldable, bendable, or rollable, such that the entire organic light emitting diode display may be flexible, stretchable, foldable, bendable, and/or rollable.

The plurality of pixels PXns are positioned on the substrate SUB, corresponding to the display area DIA of the substrate SUB. The plurality of pixels PXns are connected to the plurality of data lines DAs, respectively, and include an organic light emitting diode which emits light having a luminance corresponding to a driving current corresponding to data signals supplied from the data lines DAs, and a plurality of thin film transistors and at least one capacitor which control the driving current flowing in the organic light emitting diode. The plurality of pixels PXns each include the organic light emitting diode, such that a plurality of organic light emitting diodes and a plurality of thin film transistors connected to the plurality of organic light emitting diodes, respectively, are positioned on the display area DIA of the substrate SUB.

For convenience of explanation, the plurality of pixels PXns may be connected to a plurality of scan lines, respectively, which are connected to a gate driver for supplying different scan signals and may be further connected to a driving power supply line and an initialization, power supply line which supply a voltage. Further, a second electrode which is a cathode of the organic light emitting diode included in each of the plurality pixels PXn, may be connected to a common power supply. A detailed structure of each of the plurality of pixels will be described below. The foregoing gate driver, plurality of scan lines, driving power supply line, and initialization power supply line will be described below but are not limited thereto, and therefore may be connected to the plurality of pixels PXns, respectively, in various forms known to those skilled in the art.

The plurality of pixels PXns include a first pixel PX1 which is positioned in a central area CA of the display area DIA of the substrate and a second pixel PX2 which is positioned in an outer region EA of the display area DIA.

Here, the outer region EA of the display area DIA of the substrate SUB may be a region adjacent to the data driver DD but is not limited thereto. As long as the outer region EA is a region adjacent to the central area CA of the display area DIA of the substrate SUB, the outer region EA may correspond to any region within the display area DIA of the substrate SUB.

The plurality of data lines DAs each extend in one direction on the substrate SUB and are connected to the plurality of pixels PXns, respectively.

The data driver DD is positioned on the non-display area NDA of the substrate SUB and is connected to the plurality of data lines DAs. The data driver DD supplies data signals to the plurality of data lines DAs, respectively, corresponding to control signals supplied from external devices, such as a timing controller. The data signal supplied from the data driver DD to the data line DA is supplied to one pixel PXn selected by the scan signal when the scan signal is supplied from the scan line to the selected one pixel PXn. Next, one pixel PXn is charged with a voltage corresponding to the data signal and emits light having a luminance corresponding thereto.

Next, a circuit of one pixel PXn of the organic light emitting diode display according to the exemplary embodiment of the present invention will be described in more detail with reference to FIG. 2.

Figure 2:
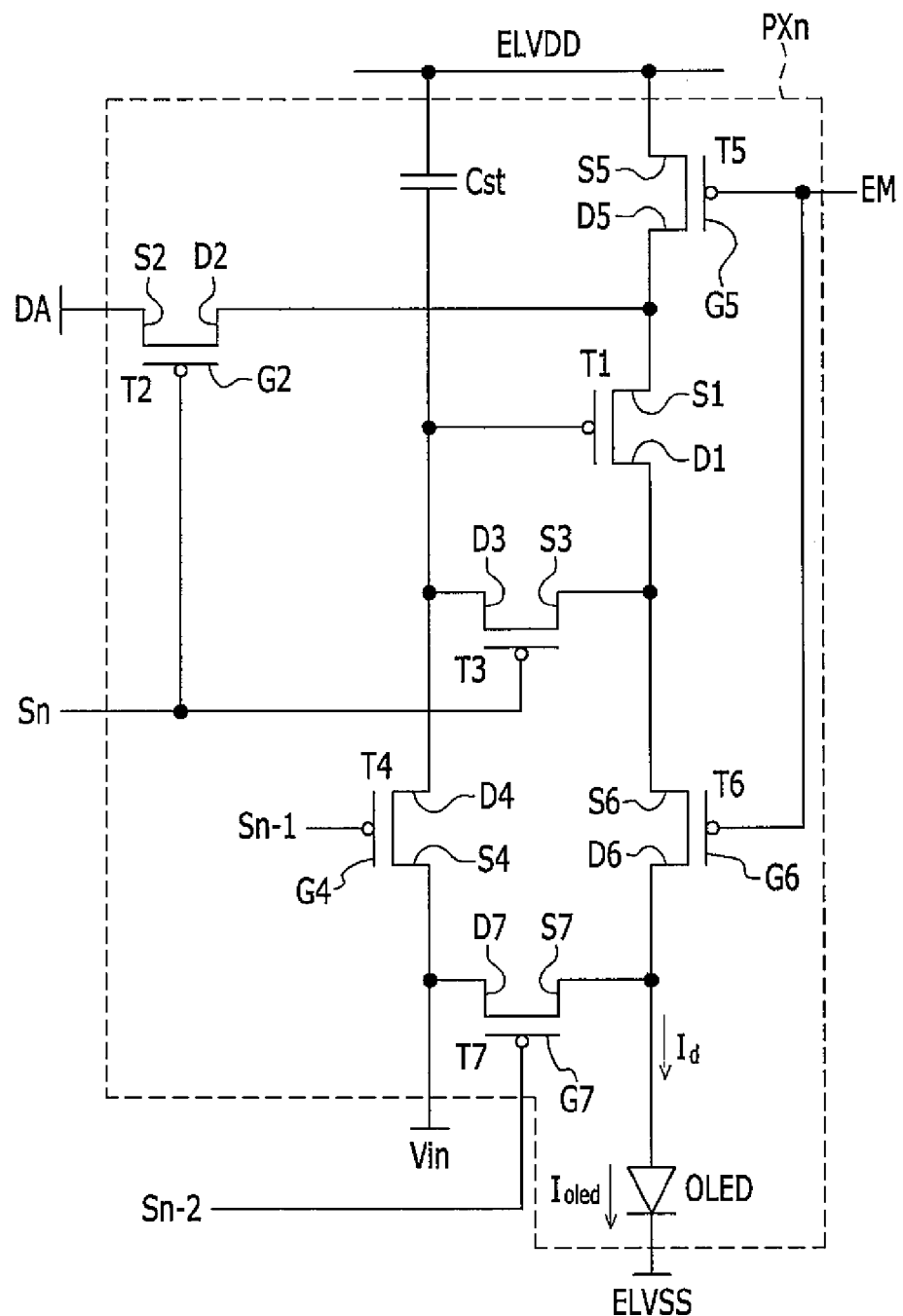
FIG. 2 is a circuit diagram illustrating a pixel of an organic light emitting diode display according to an exemplary embodiment of the present invention illustrated in FIG. 1.

FIG. 2 is a circuit diagram illustrating a pixel of an organic light emitting diode display according to an exemplary embodiment of the present invention illustrated in FIG. 1.

As illustrated in FIG. 1, one pixel PXn of the organic light emitting diode display according to an exemplary embodiment of the present invention includes a plurality of thin film transistors T1, T2, T3, T4, T5, T6, and T7, a plurality of wirings Sn, Sn−1, Sn−2, EM, Vin, DA, and ELVDD which are selectively connected to the plurality of thin film transistors T1, T2, T3, T4, T5, T6, and T7, a capacitor Cst, and an organic light emitting diode (OLED).

The plurality of thin film transistors T1, T2, T3, T4, T5, T6, and T7 include a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 is connected to a third drain electrode D3 of the third thin film transistor T3 and a fourth drain electrode D4 of the fourth thin film transistor T4. A first source electrode S1 of the first thin film transistor T1 is connected to a second drain electrode D2 of the second thin film transistor T2 and a fifth drain electrode D5 of the fifth thin film transistor T5. A first drain electrode D1 of the first think film transistor T1 is connected to a third source electrode S3 of the third thin film transistor T3 and a sixth source electrode S6 of the sixth thin film transistor T6.

A second gate electrode G2 of the second thin film transistor T2 is connected to a first scan line Sn, the second source electrode S2 is connected to a data line DA, and the second drain electrode D2 is connected to the first source electrode S1 of the first thin film transistor T1.

A third gate electrode G3 of the third thin film transistor T3 is connected to the first scan line Sn, the third source electrode S3 is connected to the first drain electrode D1 of the first thin film transistor T1, and the third drain electrode D3 is connected to the first gate electrode G1 of the first thin film transistor T1.

A fourth gate electrode G4 of a fourth thin film transistor T4 is connected to a second scan line Sn−1, a fourth source electrode S4 is connected to an initialization power supply line Vin, and the fourth drain electrode D4 is connected to the first gate electrode G1 of the first thin film transistor T1.

A fifth gate electrode G5 of a fifth thin film transistor T5 is connected to an emission control line EM, the source electrode is connected to a driving power supply line ELVDD, and the fifth drain electrode D5 is connected to the first source electrode S1 of the first thin film transistor T1.

A sixth gate electrode G6 of a sixth thin film transistor T6 is connected to the emission control line EM and a sixth source electrode S6 is connected to the first drain electrode D1 of the first thin film transistor T1.

A seventh gate electrode G7 of a seventh thin film transistor T7 is connected to a third scan line Sn−2, a seventh source electrode S7 is connected to the organic light emitting diode (OLEO), and a seventh drain electrode D7 is connected to the fourth source electrode S4 of the fourth thin film transistor T4.

The foregoing plurality of scan lines include the first scan line Sn which transfers first scan signals to the second gate electrode G2 and the third gate electrode G3 of the second thin film transistor T2 and the third thin film transistor T3, respectively, the second scan line Sn−1 which transfers a second scan signal to the fourth gate electrode G4 of the fourth thin film transistor T4, the third scan line Sn−2 which transfers a third scan signal to a seventh gate electrode G7 of the seventh thin film transistor T7, and an emission control line EM which transfers emission control signals to the fifth gate electrode G5 and the sixth gate electrode G6 of the fifth thin film transistor T5 and the sixth thin film transistor T6, respectively.

The capacitor Cst includes one electrode which is connected to the driving power supply line ELVDD and the other electrode which is connected to the first gate electrode G1 and a third drain electrode D3 of the third thin film transistor T3.

Figure 4:
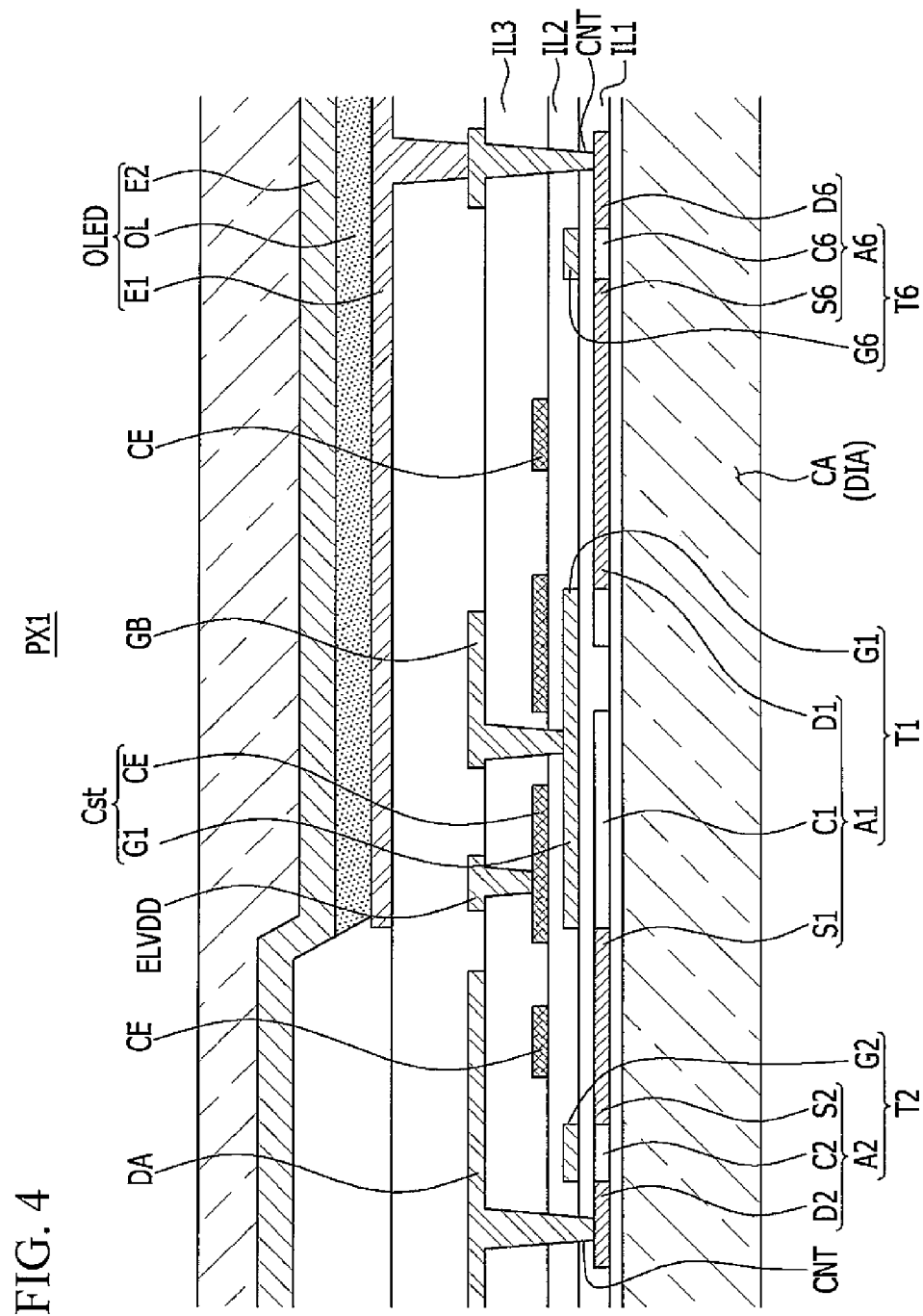
FIG. 4 is a cross-sectional view taken along the line IV-IV of FIG. 3.

The organic light emitting diode OLED includes a first electrode, a second electrode positioned on the first electrode, and an organic emission layer positioned between the first electrode and the second electrode, for example, as shown in FIG. 4. The first electrode of the organic light emitting diode (OLED) is connected to the seventh source electrode S7 of the seventh thin film transistor T7 and the sixth drain electrode D6 of the sixth thin film transistor T6, respectively, and the second electrode is connected to a common power supply ELVSS to which the common signal is transferred.

As an example of driving of the pixel circuit, first, when the third scan signal is transferred to the third scan line Sn−2 to turn on the seventh thin film transistor T7, a residual current flowing in the first electrode of the organic light emitting diode OLED exits to the fourth thin film transistor T4 through the seventh thin film transistor T7, such that the organic light emitting diode (OLED) suppresses light from being unexpectedly emitted due to the residual current flowing in the first electrode of the organic light emitting diode OLED.

Next, when the second scan signal is transferred to the second scan line Sn−1 and the initialization signal is transferred to the initialization power supply line Vin, the fourth thin film transistor T4 is turned on and thus an initialization voltage by the initialization signal is supplied to the first gate electrode G1 of the first thin film transistor T1 and the other electrode of the capacitor Cst through the fourth thin film transistor T4, such that the first gate electrode G1 and the capacitor Cst are initialized. In this case, the first thin film transistor T1 is turned on while the first gate electrode G1 is initialized.

Next, when the first scan signal is transferred to the first scan line Sn and the data signal is transferred to the data line DA, the second thin film transistor T2 and the third thin film transistor T3 are each turned on to supply a data voltage Vd by the data signal to the first gate electrode G1 through the second thin film transistor T2, the first thin film transistor T1, and the third thin film transistor T3. In this case, the voltage supplied to the first gate electrode G1, i.e., a compensation voltage {Vd+Vth, Vth is a negative (−) value} which is reduced by as much as the threshold voltage Vth of the first thin film transistor T1 from the data voltage Vd supplied from the first data line DA, is supplied. The compensation voltage (Vd+Vth) supplied to the first gate electrode G1 is supplied to the other electrode of the capacitor Cst which is connected to the first gate electrode G1.

Next, a driving voltage Vel by the driving signal is supplied from the driving power supply line ELVDD to one electrode of the capacitor Cst and the foregoing compensation voltage (Vd+Vth) is supplied to the other electrode thereof, and thus the capacitor Cst is stored with a charge corresponding to a difference in the voltage applied to both electrodes, such that the first thin film transistor T1 is turned on for a predetermined time.

Next, when the emission control signal is applied to the emission control line EM, the fifth thin film transistor T5 and the sixth thin film transistor T6 are each turned on and thus the driving voltage Vel by the driving signal from the driving power supply line ELVDD is supplied to the first thin film transistor T1 through the fifth thin film transistor T5.

Then, a driving current Id which corresponds to a difference between the voltage supplied to the first gate electrode G1 and the driving voltage Vel by the capacitor Cst flows in the first drain electrode D1 of the first thin film transistor T1 while the driving voltage Vel passes through the first thin film transistor T1 which is turned on by the capacitor Cst and the driving current Id is supplied to the organic light emitting diode (OLED) through the sixth thin film transistor T6, such that the organic light emitting diode (OLED) emits light for a predetermined time.

The pixel circuit of the organic light emitting diode display according to the exemplary embodiment of the present invention is configured to include the first thin film transistor T1 to the seventh thin film transistor T7, the capacitor Cst, the first scan line Sn to the third scan line Sn−2, the data line DA, the driving power supply line ELVDD, and the initialization power supply line Vin, but is not limited thereto and a pixel circuit of an organic light emitting diode display according to another exemplary embodiment of the present invention may be configured to include a plurality of thin film transistors, at least one capacitor, and wirings including at least one scan line and at least one driving power supply line.

Hereinafter, among the plurality of pixels PXns of the organic light emitting diode display according to the exemplary embodiment of the present invention described with reference to FIGS. 3 to 6, arrangements of the first pixel PXn which is positioned in the central area CA of the display area DIA of the substrate SUB and a second pixel PX2 which is located in the outer region EA of the display area DIA, respectively, will be described.

Insulating layers are positioned between components which are positioned on different layers as described below, in which the insulating layer may be an inorganic insulating layer or an organic insulating layer which is made of silicon nitride, silicon oxide, or the like. Further, these insulating layers may be formed in a single layer or a plurality of layers.

Figure 3:
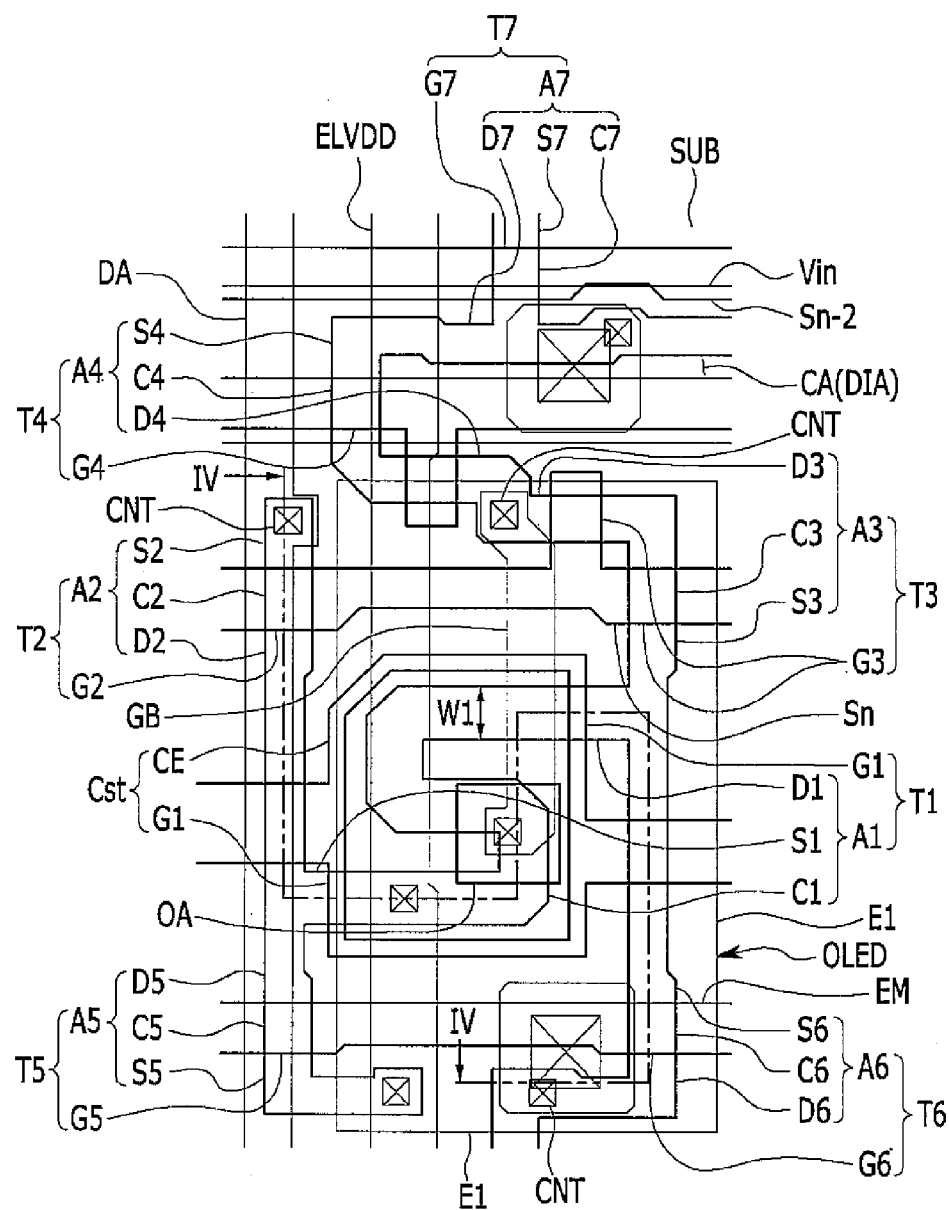
FIG. 3 is a plan view illustrating a first pixel of an organic light emitting diode display according to an exemplary embodiment of the present invention illustrated in FIG. 1.

FIG. 3 is a plan view illustrating a first pixel of an organic light emitting diode display according to an exemplary embodiment of the present invention illustrated in FIG. 1. FIG. 4 is a cross-sectional view taken along the line IV-IV of FIG. 3.

As illustrated in FIGS. 3 and 4, the first pixel PX1 which is located in the central area CA of the display area DIA of the substrate SUB includes the first thin film transistor T1, the second thin film transistor T2, the third thin film transistor T3, the fourth thin film transistor T4; the fifth thin film transistor T5, the sixth thin film transistor T6, the seventh thin film transistor T7, the first scan line Sn, the second scan line Sn−1, the third scan line Sn−2, the emission control line EM, the capacitor Cst, the data line DA, the driving power supply line ELVDD, a gate bridge GB, the initialization power supply line Vin, and the organic light emitting diode (OLED). Here, the first thin film transistor T1, the second thin film transistor T2, the third thin film transistor T3, the fourth thin film transistor T4, the fifth thin film transistor T5, the sixth thin film transistor T6, and the seventh thin film transistor T7 of the first pixel PX1 may be central thin film transistors which are positioned in the central area CA of the display area DIA of the substrate SUB.

The first thin film transistor T1 is positioned on the substrate SUB and includes a first active layer A1 and the first gate electrode G1.

The first active layer A1 includes the first source electrode S1, the first channel C1, and the first drain electrode D1. The first source electrode S1 is connected to the second drain electrode D2 of the second thin film transistor T2 and the fifth drain electrode D5 of the fifth thin film transistor T5, respectively, and the first drain electrode D1 is connected to the third source electrode S3 of the third thin film transistor T3 and the sixth source electrode S6 of the sixth thin film transistor T6, respectively. The first channel C1 which is a channel region of the first active layer A1 overlapping the first gate electrode G1 is bent at least once and extends within a space overlapping the first gate electrode G1 which is a limited space and thus the length of the first channel C1 may be formed to be long, such that a driving range of a gate voltage applied to the first gate electrode G1 may be formed to be wide. As a result, a magnitude of the gate voltage applied to the first gate electrode G1 is changed within the wide driving range to more delicately control a gray level of light emitted from the organic light emitting diode (OLED), thereby improving a quality of image that is displayed from the organic light emitting diode display. A shape of the first active layer A1 may be variously changed and may be changed in various forms such as 'inverse S', '8', 'NI', and 'W'.

The first active layer A1 may be made of poly-silicon or an oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and zinc oxide (ZnO), indium-gallium-zinc oxide (InGaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. In the case in which the first active layer A1 is made of the oxide semiconductor, a separate protecting layer may be added in order to protect the oxide semiconductor vulnerable to an external environment such as exposure to a high temperature, or the like.

The first channel C1 of the first active layer A1 may be channel-doped with N type impurities or P type impurities and the first source electrode S1 and the first drain electrode D1 are spaced apart from each other, having the first channel C1 therebetween and may each be doped with doping impurities having an opposite type to the doping impurities doped in the first channel C1.

The first gate electrode G1 is positioned on the first channel C1 of the first active layer A1 and has an island shape. The first gate electrode G1 is connected to the fourth drain electrode D4 of the fourth thin film transistor T4 and the third drain electrode D3 of the third thin film transistor T3 by the gate bridge GB through a contact hole CNT. The first gate electrode G1 overlaps a capacitor electrode CE and may also serve as the other electrode of the capacitor Cst simultaneously while serving as the gate electrode of the first thin film transistor T1. That is, the first gate electrode G1 forms the capacitor Cst, along with the capacitor electrode CE.

The second thin film transistor T2 is positioned on the substrate (SUB) and includes the second active layer A2 and the second gate electrode G2. The second active layer A2 includes the second source electrode S2, the second channel C2, and the second drain electrode D2. The second source electrode S2 is connected to the data line DA through the contact hole CNT and the second drain electrode D2 is connected to the first source electrode S1 of the first thin film transistor T1. The second channel C2 which is a channel region of the second active layer A2 overlapping the second gate electrode G2 is positioned between the second source electrode S2 and the second drain electrode D2. That is, the second active layer A2 is connected to the first active layer A1.

The second channel C2 of the second active layer A2 may be channel-doped with N type impurities or P type impurities and the second source electrode S2 and the second drain electrode D2 are spaced apart from each other, having the first channel C1 therebetween and may each be doped with doping impurities having an opposite type to the doping impurities doped in the first channel C1. The second active layer A2 is positioned on the same layer as the first active layer A1, made of the same or substantially the same material as the first active layer A1, and integrally formed with the first active layer A1.

The second gate electrode G2 is positioned on the second channel C2 of the second active layer A2 and integrally formed with the first scan line Sn.

The third thin film transistor T3 is positioned on the substrate SUB and includes the third active layer A3 and the third gate electrode G3.

The third active layer A3 includes the third source electrode S3, the third channel C3, and the third drain electrode D3. The third source electrode S3 is connected to the first drain electrode D1 and the third drain electrode D3 is connected to the first gate electrode G1 of the first thin film transistor T1 by the gate bridge GB through the contact hole CNT. The third channel C3 which is a channel region of the third active layer A3 overlapping the third gate electrode G3 is positioned between the third source electrode S3 and the third drain electrode D3. That is, the third active layer A3 connects between the first active layer A1 and the first gate electrode G1.

The third channel C3 of the third active layer A3 may be channel-doped with N type impurities or P type impurities and the third source electrode S3 and the third drain electrode D3 are spaced apart from each other, having the third channel C3 therebetween and may each be doped with doping impurities having an opposite type to the doping impurities doped in the third channel C3. The third active layer A3 is positioned on the same layer as the first active layer A1 and the second active layer A2, made of the same or substantially the same material as the first active layer A1 and the second active layer A2, and integrally formed with the first active layer A1 and the second active layer A2.

The third gate electrode G3 is positioned on the third channel C3 of the third active layer A3 and integrally formed with the first scan line Sn. The third gate electrode G3 is formed as a dual gate electrode.

The fourth thin film transistor T4 is positioned on the substrate SUB and includes a fourth active layer A4 and the fourth gate electrode G4.

The fourth active layer A4 includes the fourth source electrode S4, the fourth channel C4, and the fourth drain electrode D4. The fourth source electrode S4 is connected to the initialization power supply line Vin through the contact hole and the fourth drain electrode D4 is connected to the first gate electrode G1 of the first thin film transistor T1 by the gate bridge GB through the contact hole. The fourth channel C4 which is a channel region of the fourth active layer A4 overlapping the fourth gate electrode G4 is positioned between the fourth source electrode S4 and the fourth drain electrode D4. That is, the fourth active layer A4 is connected to the third active layer A3 and the first gate electrode G1, respectively, concurrently (e.g., simultaneously) while connecting between the initialization power supply line Vin and the first gate electrode G1.

The fourth channel C4 of the fourth active layer A4 may be channel-doped with N type impurities or P type impurities and the fourth source electrode S4 and the fourth drain electrode D4 are spaced apart from each other, having the fourth channel C4 therebetween and may each be doped with doping impurities having an opposite type to the doping impurities doped in the fourth channel C4. The fourth active layer A4 is positioned on the same layer as the first active layer A1, the second active layer A2, and the third active layer A3, made of the same or substantially the same material as the first active layer A1, the second active layer A2, and the third active layer A3, and integrally formed with the first active layer A1, the second active layer A2, and the third active layer A3.

The fourth gate electrode G4 is positioned on the fourth channel C4 of the fourth active layer A4 and integrally formed with the second scan line Sn−1. The fourth gate electrode G4 is formed as a dual gate electrode.

The fifth thin film transistor T5 is positioned on the substrate SUB and includes a fifth active layer A5 and the fifth gate electrode G5.

The fifth active layer A5 includes the fifth source electrode S5, the fifth channel C5, and the fifth drain electrode D5. The fifth source electrode S5 is connected to the driving power supply line ELVDD through the contact hole CNT and the fifth drain electrode D5 is connected to the first source electrode S1 of the first thin film transistor T1. The fifth channel G5 which is a channel region of the fifth active layer A5 overlapping the fifth gate electrode G5 is positioned between the fifth source electrode S5 and the fifth drain electrode D5. That is, the fifth active layer A5 connects between the driving power supply line ELVDD and the first active layer A1.

The fifth channel C5 of the fifth active layer A5 may be channel-doped with N type impurities or P type impurities and the fifth source electrode S5 and the fifth drain electrode D5 are spaced apart from each other, having the fifth channel C5 therebetween and may each be doped with doping impurities having an opposite type to the doping impurities doped in the fifth channel C5. The fifth active layer A5 is positioned on the same layer as the first active layer A1, the second active layer A2, the third active layer A3, the fourth active layer made of the same or substantially the same material as the first active layer A1, the second active layer A2, the third active layer A3, and the fourth active layer A4, and integrally formed with the first active layer A1, the second active layer A2, the third active layer A3, and the fourth active layer A4.

The fifth gate electrode G5 is positioned on the fifth channel C5 of the fifth active layer A5 and integrally formed with the emission control line EM.

The sixth thin film transistor T6 is positioned on the substrate SUB and includes a sixth active layer A6 and a sixth gate electrode G6.

The sixth active layer A6 includes the sixth source electrode S6, the sixth channel C6, and the sixth drain electrode D6. The sixth source electrode S6 is connected to the first drain electrode D1 of the first thin film transistor T1 and the sixth drain electrode D6 is connected to the first electrode E1 of the organic light emitting diode (OLED) through the contact hole CNT. The sixth channel C6 which is a channel region of the sixth active layer A6 overlapping the sixth gate electrode G6 is positioned between the sixth source electrode S6 and the sixth drain electrode D6. That is, the sixth active layer A6 connects between the first active layer A1 and the first electrode E1 of the organic light emitting diode (OLED).

The sixth channel C6 of the sixth active layer A6 may be channel-doped with N type impurities or P type impurities and the sixth source electrode S6 and the sixth drain electrode D6 are spaced apart from each other, having the sixth channel C6 therebetween and may each be doped with doping impurities having an opposite type to the doping impurities doped in the sixth channel C6. The sixth active layer A6 is positioned on the same layer as the first active layer A1, the second active layer A2, the third active layer A3, the fourth active layer A4 made of the same or substantially the same material as the first active layer A1, the second active layer A2, the third active layer A3, and the fourth active layer A4, and the fifth active layer A5 integrally formed with the first active layer A1, the second active layer A2, the third active layer A3, the fourth active layer A4, and the fifth active layer A5.

The sixth gate electrode G6 is positioned on the sixth channel C6 of the sixth active layer A6 and integrally formed with the emission control line EM.

The seventh thin film transistor T7 is positioned on the substrate SUB and includes the seventh active layer A7 and the seventh gate electrode G7.

The seventh active layer A7 includes the seventh source electrode S7, the seventh channel C7, and the seventh drain electrode D7

The seventh source electrode S7 is connected to a first electrode of an organic light emitting diode of another pixel (a pixel positioned over or adjacent the pixel of FIG. 2) which is not illustrated in FIG. 3 and the seventh drain electrode D7 is connected to the fourth source electrode S4 of the fourth thin film transistor T4. The seventh channel C7 which is a channel region of the seventh active layer A7 overlapping the seventh gate electrode G7 is positioned between a seventh source electrode S7 and a seventh drain electrode D7. That is, the seventh active layer A7 connects between the first electrode and the fourth active layer A4 of the organic light emitting diode.

The seventh channel C7 of the seventh active layer A7 may be channel-doped with N type impurities or P type impurities and the seventh source electrode S7 and the seventh drain electrode D7 are spaced apart from each other, having the seventh channel C7 therebetween and may each be doped with doping impurities having an opposite type to the doping impurities doped in the seventh channel C7. The seventh active layer A7 is positioned on the same layer as the first active layer A1, the second active layer A2, the third active layer A3, the fourth active layer A4, the fifth active layer A5, and the sixth active layer A6, made of the same or substantially the same material as the first active layer A1; the second active layer A2, the third active layer A3, the fourth active layer A4, the fifth active layer A5, and the sixth active layer A6, and integrally formed with the first active layer A1, the second active layer A2, the third active layer A3, the fourth active layer A4, the fifth active layer A5, and the sixth active layer A6.

The seventh gate electrode G7 is positioned on the seventh channel C7 of the seventh active layer A7 and integrally formed with the second scan line Sn−2.

The first active layer A1 of the first thin film transistor T1, the second active layer A2 of the second thin film transistor T2, the third active layer A3 of the third thin film transistor T3, the fourth active layer A4 of the fourth thin film transistor T4, the fifth active layer A5 of the fifth thin film transistor T5, the sixth active layer A6 of the sixth thin film transistor T6, and the seventh active layer A7 of the seventh thin film transistor T7, which are the central thin film transistors of the first pixel PX1, are connected to each other and the first active layer A1, the second active layer A2, the third active layer A3, the fourth active layer A4, the fifth active layer A5, the sixth active layer A6, and the seventh active layer A7 each have a first width W1.

A first insulating layer IL1, a second insulating layer IL2, and a third insulating layer IL3 are sequentially stacked on the first active layer A1, the second active layer A2, the third active layer A3, the fourth active layer A4, the fifth active layer A5, the sixth active layer A6, and the seventh active layer A7. The first insulating layer IL1, the second insulating layer IL2, and the third insulating layer IL3 may each be an inorganic insulating layer or an organic insulating layer made of silicon nitride, silicon oxide, and the like. Further, the insulating layers may be formed of a single layer or a multilayer. The foregoing plurality of contact holes CNTs are selectively formed on the first insulating layer IL1, the second insulating layer IL2, and the third insulating layer IL3, respectively. The first insulating layer IL1 contacts the first active layer A1, the second active layer A2, the third active layer A3, the fourth active layer A4, the fifth active layer A5, the sixth active layer A6, and the seventh active layer A7, respectively.

The first scan line Sn is positioned on the second active layer A2 and the third active layer A3, and extends in one direction crossing the second active layer A2 and the third active layer A3 and is connected to the second gate electrode G2 and the third gate electrode G3, being integrally formed with the second gate electrode G2 and the third gate electrode G3.

The second scan line Sn−1 is positioned on the fourth active layer A4, being spaced apart from the first scan line Sn, extends in one direction crossing the fourth active layer A4, and is connected to the fourth gate electrode G4, being integrally formed with the fourth gate electrode G4.

The third scan line Sn−2 is positioned on the seventh active layer A7, being spaced apart from the second scan line Sn−1, extends in one direction crossing the seventh active layer A7, and is connected to the seventh gate electrode G7, being integrally formed with the seventh gate electrode G7.

The emission control line EM is positioned on the fifth active layer A5 and the sixth active layer A6, being spaced apart from the first scan line Sn and extends in one direction crossing the fifth active layer A5 and the sixth active layer A6 and is connected to the fifth gate electrode G5 and the sixth gate electrode G6, being integrally formed with the fifth gate electrode G5 and the sixth gate electrode G6.

As described above, the emission control line EM, the third scan line Sn−2, the second scan line Sn−1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 are positioned on the same layer and made of the same or substantially the same material. Meanwhile, according to another exemplary embodiment of the present invention, the emission control line EM, the third scan line Sn−2, the second scan line Sn−1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 each are selectively positioned on different layers and made of different materials.

The capacitor Cst includes one electrode and the other electrode which face each other, and includes the insulating layer therebetween. The above-mentioned one electrode may be the capacitor electrode C3 and the other electrode may be the first gate electrode G1. The capacitor electrode CE is positioned on the first gate electrode G1 and is connected to the driving power supply line ELVDD through the contact hole.

The capacitor electrode CE forms the capacitor Cst along with the first gate electrode G1, and the first gate electrode G1 and the capacitor electrode CE are made of different metals from each other. According to another exemplary embodiment of the present invention, the first gate electrode G1 and the capacitor electrode CE are made of the same or substantially the same metal on different layers.

The capacitor electrode CE has an opening OA through which a portion of the first gate electrode G1 is exposed and the gate bridge GB is connected to the first gate electrode G1 through the opening OA.

The data line DA is positioned on the first scan line Sn and extends in the other direction crossing the first scan line Sn and is connected to the second source electrode S2 of the second active layer A2 through the contact hole CNT. The data line DA extends crossing the first scan line Sn, the second scan line Sn−1, the third scan line Sn−2, and the emission control line EM.

The driving power supply line ELVDD is positioned on the first scan line Sn while being spaced apart from the data line DA and extends in the other direction crossing the first scan line Sn and is connected to the fifth source electrode S5 of the fifth active layer A5 which is connected to the capacitor electrode CE and the first active layer A1 through the contact hole CNT. The driving power supply line ELVDD extends crossing the first scan line Sn, the second scan line Sn−1, the third scan line Sn−2, and the emission control line EM.

The gate bridge GB is positioned on the first scan line Sn while being spaced apart from the driving power supply line ELVDD and is connected to the third drain electrode D3 of the third active layer A3 and the fourth drain electrode D4 of the fourth active layer A4 through the contact hole, respectively, and thus is connected to the first gate electrode G1 exposed by the opening OA of the capacitor electrode CE through the contact hole.

As described above, the data line DA, the driving power supply line ELVDD, and the gate bridge GB are positioned on the same layer and made of the same or substantially the same material. Meanwhile, according to another exemplary embodiment of the present invention, the data line DA, the driving power supply line ELVDD, and the gate bridge GB are each selectively positioned on different layers and may be made of different materials from each other.

The initialization power supply line Vin is positioned on the second scan line Sn−1 and is connected to the fourth source electrode S4 of the fourth active layer A4 through the contact hole. The initialization power supply line Vin is positioned on the same layer as the first electrode E1 of the organic light emitting diode (OLED) and is made of the same or substantially the same material. Meanwhile, according to another exemplary embodiment of the present invention, the initialization power supply line Vin is positioned on a different layer from the first electrode E1 and may be made of one or more different materials therefrom.

The organic light emitting diode (OLED) includes the first electrode E1, an organic light emitting layer OL, and the second electrode E2. The first electrode E1 is connected to the sixth drain electrode D6 of the sixth thin film transistor T6 through the contact hole CNT. The organic light emitting layer OL is positioned between the first electrode E1 and the second electrode E2. The second electrode E2 is positioned on the organic light emitting layer OL. At least one of the first electrode E1 and the second electrode E2 may be any one of a light transmitting electrode, a light reflective electrode, and a light translucent electrode, and the light emitted from the organic light emitting layer OL may be emitted in at least one direction toward the first electrode E1 or the second electrode E2.

A capping layer covering the organic light emitting diode (OLED) may be positioned on the organic light emitting diode (OLED) and a thin film encapsulation may be positioned or an encapsulation substrate may be positioned on the organic light emitting diode (OLED), having the capping layer therebetween.

The second pixel PX2 is positioned in the outer region EA of the display area DIA of the substrate SUB, while being spaced apart from the first pixel PX1 which is positioned in the central area CA of the display area DIA of the foregoing substrate SUB.

Figure 5:
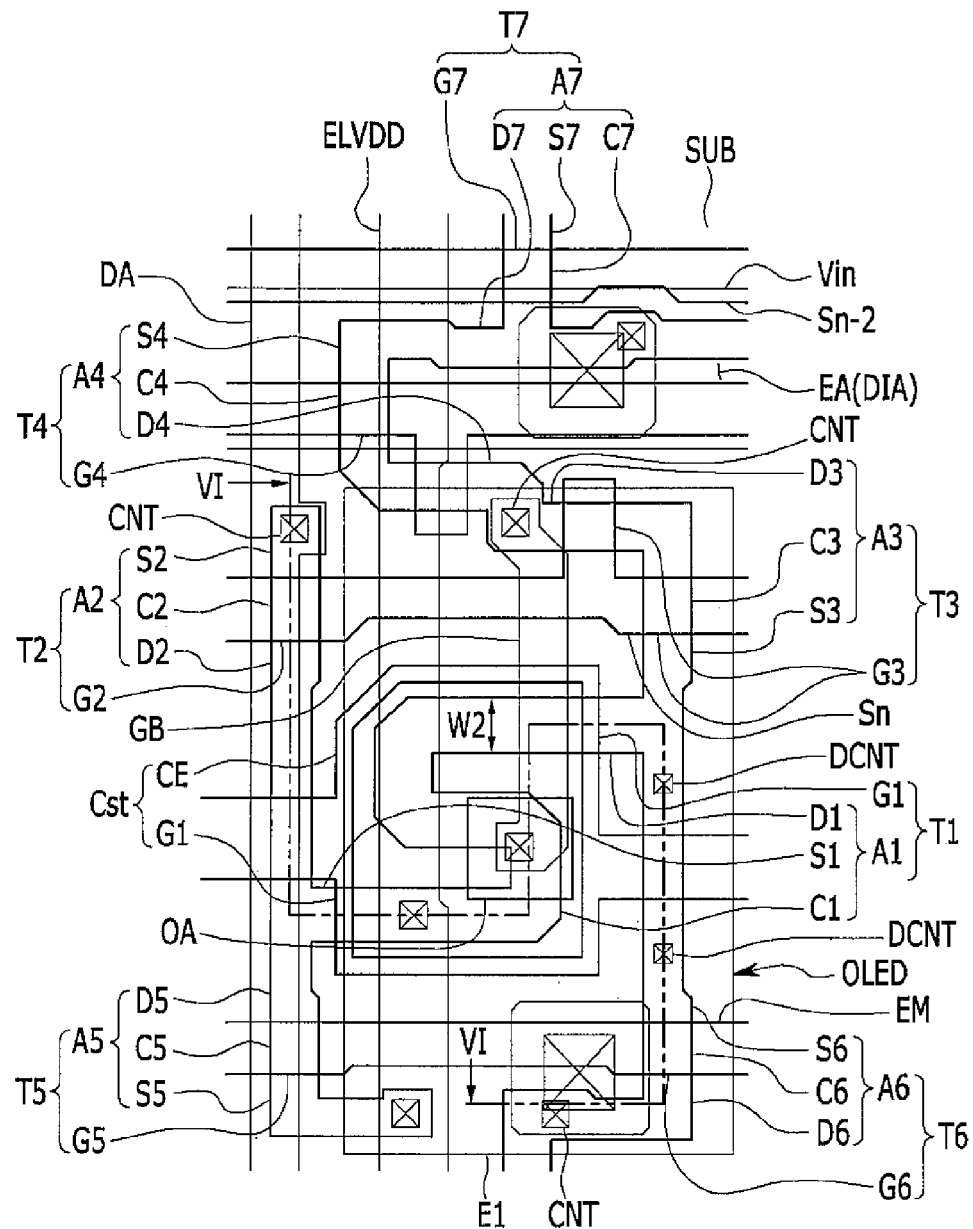
FIG. 5 is a plan view illustrating a second pixel of an organic light emitting diode display according to an exemplary embodiment of the present invention illustrated in FIG. 1.
Figure 6:
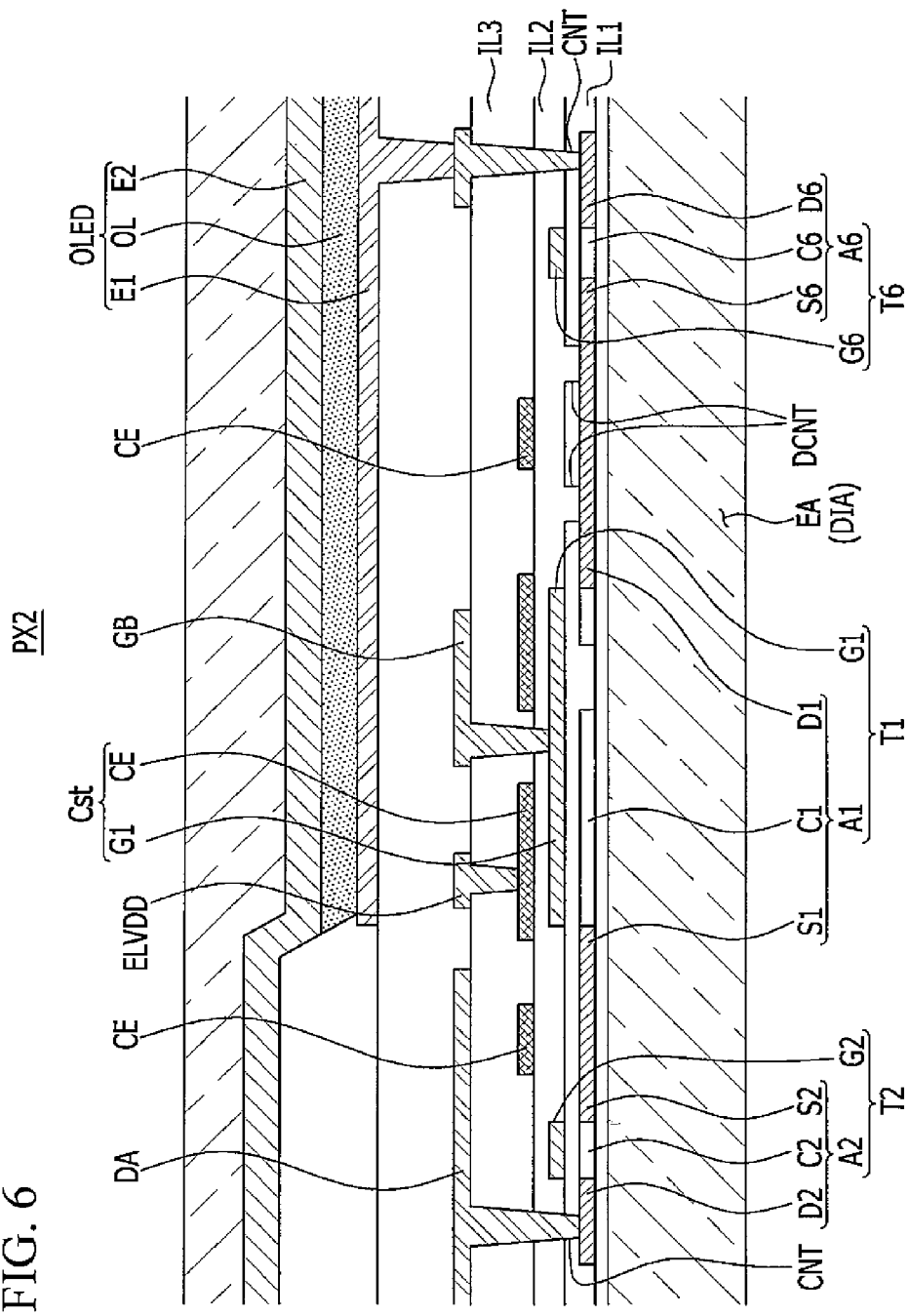
FIG. 6 is a cross-sectional view taken along the line VI-VI of FIG. 5.

FIG. 5 is a plan view illustrating a second pixel of an organic light emitting diode display according to an exemplary embodiment of the present invention illustrated in FIG. 1. FIG. 6 is a cross-sectional view taken along the line VI-VI of FIG. 5.

Hereinafter, compared with the foregoing first pixel PX1, different portions of the second pixel PX2 will be described.

As illustrated in FIGS. 5 and 6, the second pixel PX2 which is located in the outer region EA of the display area DIA of the substrate SUB includes the first thin film transistor T1, the second thin film transistor T2, the third thin film transistor T3, the fourth thin film transistor T4, the fifth thin film transistor T5, the sixth thin film transistor T6, the seventh thin film transistor T7, the first scan line Sn, the second scan line Sn−1, the third scan line Sn−2, the emission control line EM, the capacitor Cst, the data line DA, the driving power supply line ELVDD, a gate bridge GB, the initialization power supply line Vin, and the organic light emitting diode (OLED). Here, the first thin film transistor T1, the second thin film transistor T2, the third thin film transistor T3, the fourth thin film transistor T4, the fifth thin film transistor T5, the sixth thin film transistor T6, and the seventh thin film transistor T7 of the second pixel PX2 may be outer thin film transistors which are positioned in the outer region EA of the display area DIA of the substrate SUB.

The first active layer A1 of the first thin film transistor T1, the second active layer A2 of the second thin film transistor T2, the third active layer A3 of the third thin film transistor T3, the fourth active layer A4 of the fourth thin film transistor T4, the fifth active layer A5 of the fifth thin film transistor T5, the sixth active layer A6 of the sixth thin film transistor T6, and the seventh active layer A7 of the seventh thin film transistor T7, which are the outer thin film transistors of the second pixel PX2, are connected to each other, and the first active layer A1, second active layer A2, the third active layer A3, the fourth active layer A4, the fifth active layer A5, the sixth active layer A6, and the seventh active layer A7 each have a second width W2 that is greater than the first width W1 of the active layers of the foregoing central thin film transistors.

The first active layer A1 of the second pixel PX2 has the second width W2 that is greater than the first width W1 of the first active layer A1 of the first pixel PX1 because the second pixel PX2 is positioned in the outer region EA of the display area DIA and thus a photoresist material positioned in the outer region EA may be less exposed or more exposed at the outer region EA than at the central area CA during the photolithography for process forming the first active layer A1 from the single semiconductor layer. In particular, the active layer positioned in the outer region EA adjacent to the data driver DD corresponds to an edge portion at which the active layer is formed as compared with another outer region and therefore may have a width that is greater than other regions.

The second pixel PX2 includes the plurality of contact holes CNT, and the plurality of contact holes CNT include at least one dummy contact hole DCNT.

The dummy contact hole DCNT overlaps the first active layer A1 and the sixth active layer A6 and the inside of the dummy contact hole DCNT is provided with the second insulating layer IL2 covering the first insulating layer IL1.

According to an exemplary embodiment of the present invention, the dummy contact hole DCNT overlaps the first active layer A1 and the sixth active layer A6, but is not limited thereto and according to another exemplary embodiment of the present invention, the dummy contact hole DCNT may overlap at least one of the first active layer A1, the second active layer A2, the third active layer A3, the fourth active layer A4, the fifth active layer A5, the sixth active layer A6, and the seventh active layer A7.

The first active layer A1, the second active layer A2, the third active layer A3, the fourth active layer A4, the fifth active layer A5, the sixth active layer A6, and the seventh active layer A7 of each of the first pixel PX1 and the second pixel PX2 which are connected to each other are heat treated during the manufacturing process in the state in which the first active layer A1, the second active layer A2, the third active layer A3, the fourth active layer A4, the fifth active layer A5, the sixth active layer A6, and the seventh active layer A7 are covered with the first insulating layer IL1, and the first active layer A1, the second active layer A2, the third active layer A3, the fourth active layer A4, the fifth active layer A5, the sixth active layer A6, and the seventh active layer A7 of the second pixel PX2 are heat treated in the state in which the dummy contact hole DCNT is formed on the first insulating layer IL1.

As described above, the plurality of contact holes CNTs of the second pixel PX2 include at least one dummy contact hole DCNT and thus the second pixel PX2 includes a greater number of contact holes CNTs than the first pixel PX1. That is, the first insulating layer IL1 covers the active layers which are positioned in the central area CA and the outer region EA of the display area DIA and in the first insulating layer IL1, a greater number of contact holes CNTs are formed in the outer region EA than in the central area CA of the display area DIA.

Hereinafter, an effect of the organic light emitting diode display according the exemplary embodiment of the present invention will be described with reference to FIG. 7.

Figure 7:
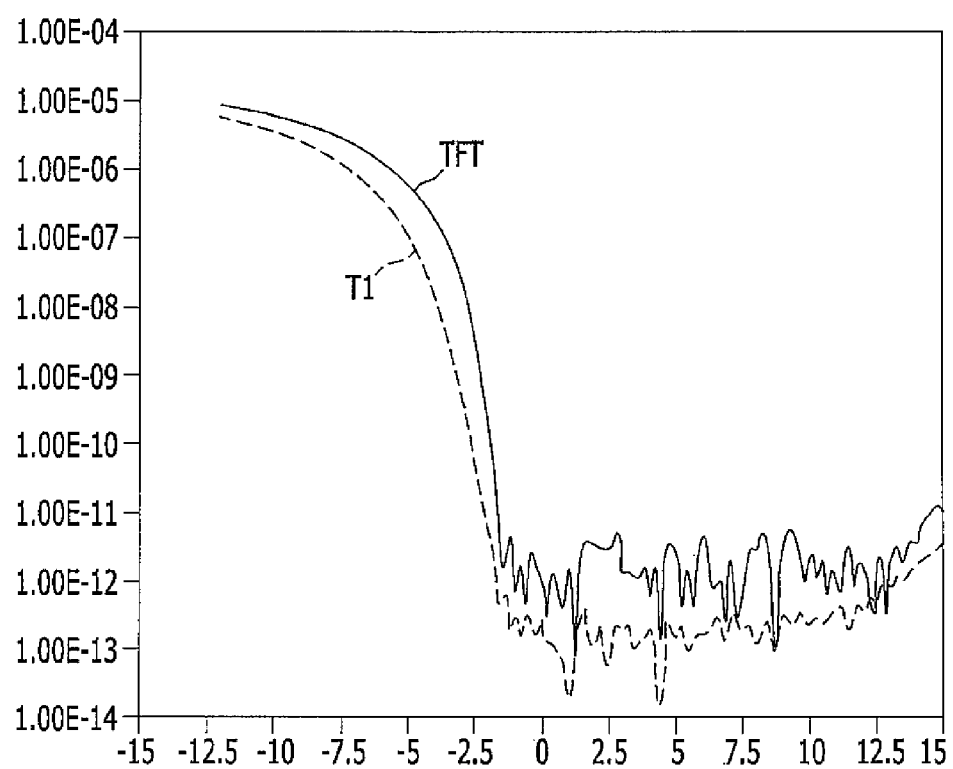
FIG. 7 is a graph illustrating an effect of an organic light emitting diode display according to an exemplary embodiment of the present invention.

FIG. 7 is a graph illustrating an effect of an organic light emitting diode display according to an exemplary embodiment of the present invention.

In FIG. 7, the X-axis represents a gate voltage Vgs applied to the gate electrode of the thin film transistor and the Y-axis represents a driving current Id flowing in the drain electrode of the thin film transistor. One of two solid lines represents a thin film transistor TFT according to a Comparative Example and the other represents the first thin film transistor T1 of the second pixel PX2 according to the exemplary embodiment. The thin film transistor TFT according to the Comparative Example has the same structure as the first thin film transistor T1 of the second pixel PX2 according to the exemplary embodiment, except for the dummy contact hole DCNT.

As illustrated in FIG. 7, it may be appreciated that transistor characteristics of the first thin film transistor T1 of the second pixel PX2 including the dummy contact hole DCNT may deteriorate more than the thin film transistor TFT according to the Comparative Example. In the state in which the first insulating layer IL1 covering the first active layer A1 is provided with the dummy contact hole DCNT, the first active layer A1 of the first thin film transistor T1 is heat treated and thus the dangling bonds of the first active layer A1 are not smoothly removed.

As such, the first thin film transistor T1 of the second pixel of the organic light emitting diode display according to the exemplary embodiment of the present invention may be the thin film transistor having reduced transistor characteristics due to the dummy contact hole DCNT.

As described-above, in the organic light emitting diode display according to an exemplary embodiment of the present invention, the first active layer A1 of the first thin film transistor T1 of the central thin film transistor of the first pixel PX1 positioned in the central area CA of the display area DIA has the first width W1. The first active layer A1 of the first thin film transistor T1 of the outer thin film transistor of the second pixel PX2 positioned in the outer region EA has the second width W2 that is than the first width W1. Thus, the first thin film transistor T1 of the second pixel PX2 has the more improved transistor characteristics (e.g., a thin film transistor having more desirable transistor characteristics) than that of the first thin film transistor T1 of the first pixel PX1, but the first insulating layer IL1 corresponding to the second pixel PX2 is provided with the dummy contact hole DCNT and thus the transistor characteristics of the first thin film transistor T1 of the second pixel PX2 deteriorates, thereby reducing or minimizing the difference between the transistor characteristics of the first thin film transistor T1 of the first pixel PX1 and the first thin film transistor T1 of the second pixel PX2.

That is, considering that transistor characteristics of the outer thin film transistor positioned in the outer region EA are more improved than those of the central thin film transistor positioned in the central area CA of the display area DIA among the plurality of thin film transistors positioned in the display area DIA of the substrate SUB due to the photolithography process error, the first insulating layer IL1 corresponding to the outer region EA is further provided with the dummy contact hole DCNT to form a greater number of contact holes CNT in the outer region EA than in the central area CA of the display area DIA to make the transistor characteristics of the outer thin film transistor positioned in the outer region EA weaker so as to reduce or minimize the difference in the transistor characteristics between the plurality of thin film transistors which are positioned over the display area DIA of the substrate SUB, thereby reducing or minimizing the difference in the luminance among the plurality of organic light emitting diodes connected to the plurality of thin film transistors. As a result, it is possible to provide the organic light emitting diode display in which the display quality deterioration of the image is reduced or minimized.

The embodiments of the present invention are described to provide the organic light emitting diode display having aspects for suppressing or reducing the difference among the current values supplied to the plurality of organic light emitting diodes OLED from occurring over the substrate (SUB) even though the difference among the widths of the active layers of the plurality of thin film transistors, respectively, inadvertently occurs over the substrate SUB.

Hereinafter, an organic light emitting diode display according to another exemplary embodiment of the present invention will be described with reference to FIGS. 8 and 9. Hereinafter, only components different from those of the organic light emitting diode display according to the exemplary embodiment of the present invention described above will be described.

Figure 8:
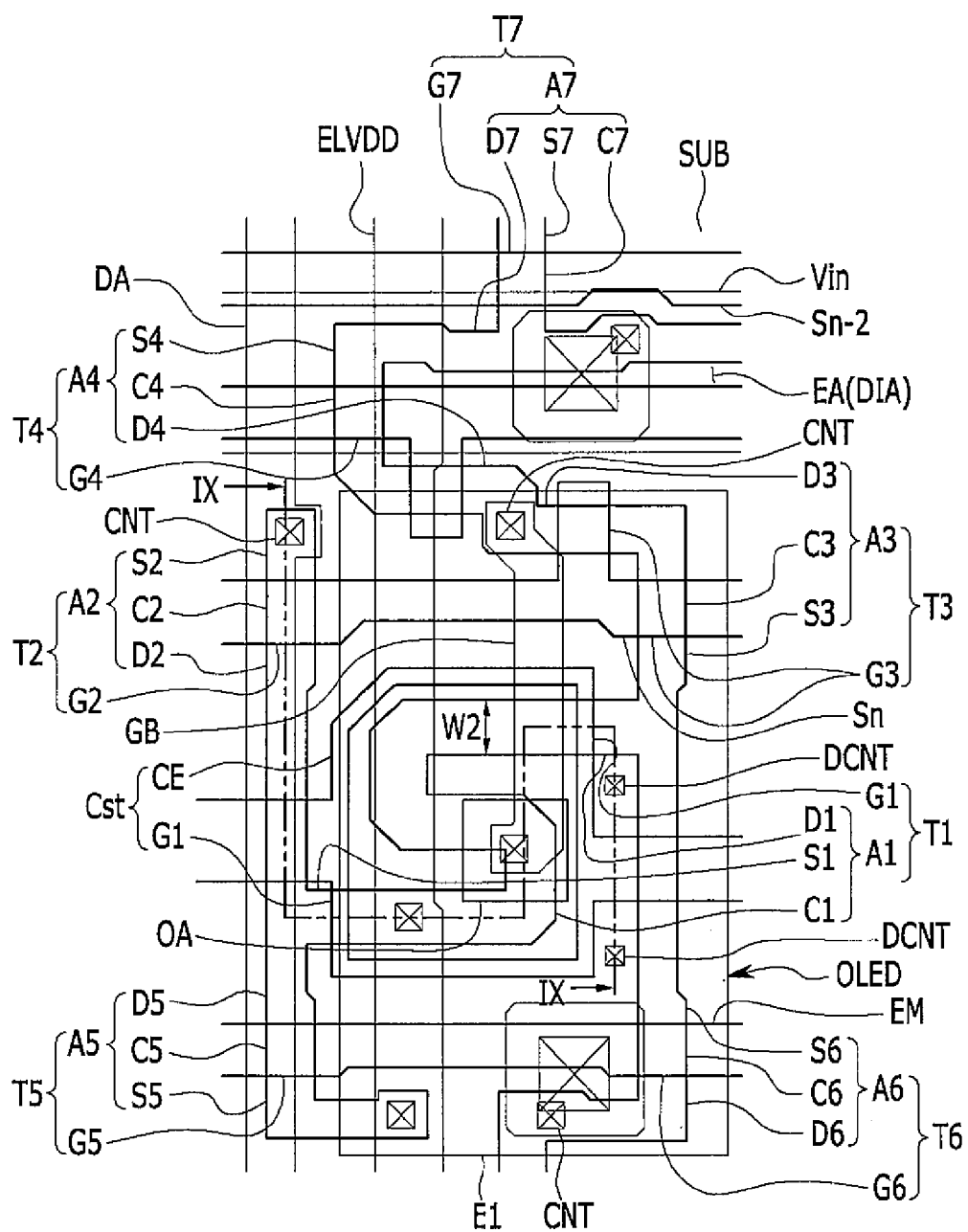
FIG. 8 is a plan view illustrating a second pixel of an organic light emitting diode display according to another exemplary embodiment of the present invention.

FIG. 8 is a plan view illustrating a second pixel of an organic light emitting diode display according to another exemplary embodiment of the present invention. FIG. 9 is a cross-sectional view taken along the line IX-IX of FIG. 8.

Figure 9:
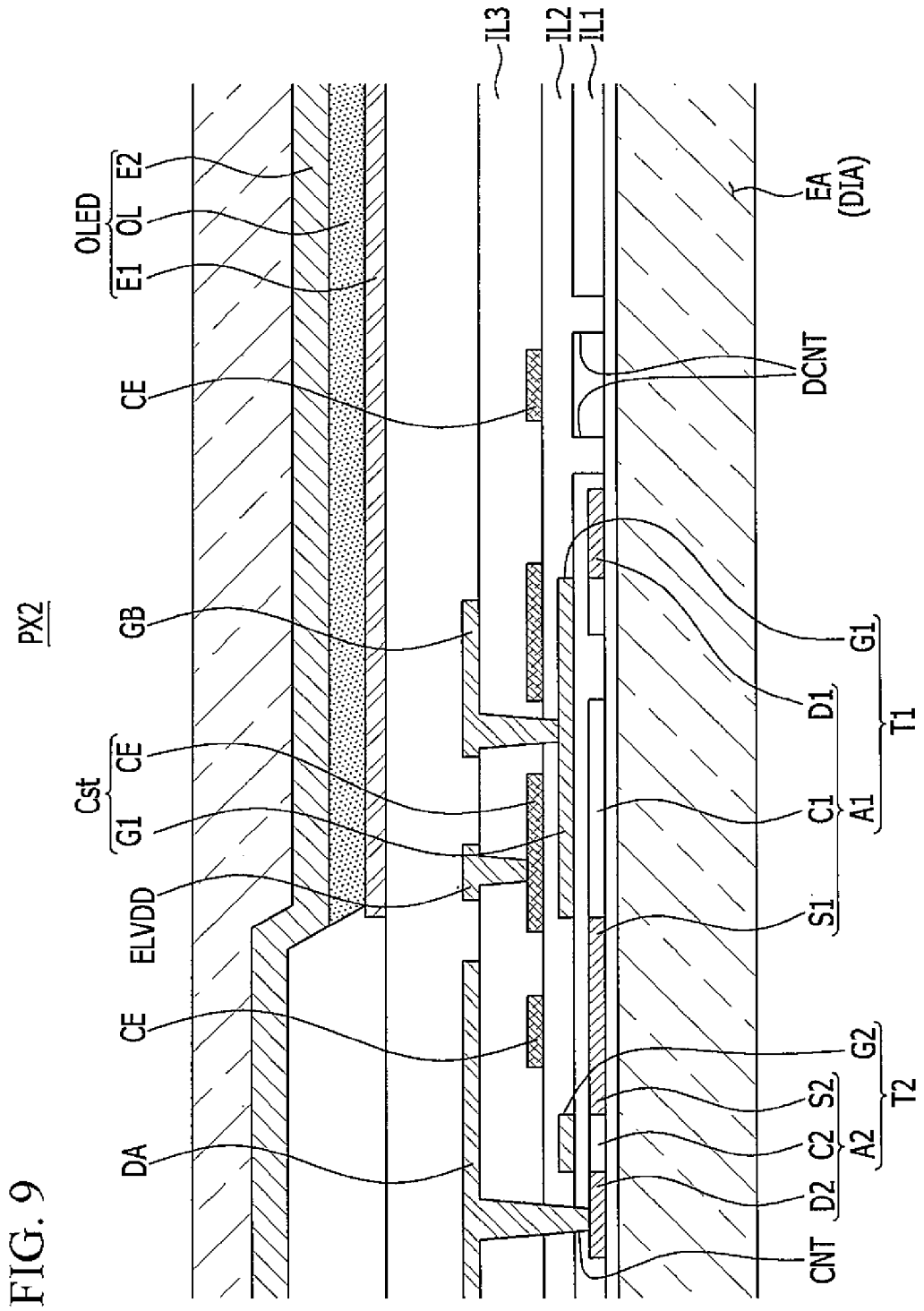
FIG. 9 is a cross-sectional view taken along the line IX-IX of FIG. 8.

As illustrated in FIGS. 8 and 9, the second pixel PX2 of the organic light emitting diode display according to another exemplary embodiment of the present invention includes the plurality of contact holes CNT, in which the plurality of contact holes CNTs includes at least one dummy contact hole DCNT.

The dummy contact hole DCNT does not overlap the first active layer A1, the second active layer A2, the third active layer A3, the fourth active layer A4, the fifth active layer A5, the sixth active layer A6, and the seventh active layer A7 and the inside of the dummy contact hole DCNT is provided with the second insulating layer IL2 which covers the first insulating layer IL1.

The first active layer A1, the second active layer A2, the third active layer A3, the fourth active layer A4, the fifth active layer A5, the sixth active layer A6, and the seventh active layer A7 of each of the first pixel PX1 the and second pixel PX2 which are connected to each other are heat treated during the manufacturing process in the state in which the first active layer A1, the second active layer A2, the third active layer A3, the fourth active layer A4, the fifth active layer A5, the sixth active layer A6, and the seventh active layer A7 are covered with the first insulating layer IL1 and the first active layer A1, the second active layer A2, the third active layer A3, the fourth active layer A4, the fifth active layer A5, the sixth active layer A6, and the seventh active layer A7 of the second pixel PX2 are heat treated in the state in which the dummy contact hole DCNT informed on the first insulating layer IL1.

As described above, the plurality of contact holes CNTs of the second pixel PX2 include at least one dummy contact hole DCNT and thus the second pixel PX2 includes a greater number of contact holes CNTs than the first pixel. That is, the first insulating layer IL1 is provided with a greater number of contact holes CNTs in the outer region EA than the central area CA of the display area DIA.

As such, the first thin film transistor T1 of the second pixel of the organic light emitting diode display according to another exemplary embodiment of the present invention is the thin film transistor having reduced transistor characteristics (e.g., a thin film transistor having less desirable transistor characteristics) due to the dummy contact hole DCNT.

As described above, according to the organic light emitting diode display according to another exemplary embodiment of the present invention, considering that transistor characteristics of the outer thin film transistor positioned in the outer region EA are more improved (e.g., having more desirable transistor characteristics) than those of the central thin film transistor positioned in the central area of the display area DIA among the plurality of thin film transistors positioned in the display area DIA of the substrate SUB due to the photolithography process error, the first insulating layer IL1 corresponding to the outer region EA is further provided with the dummy contact hole DCNT to form a greater number of contact holes CNT in the outer region EA than in the central area of the display area DIA to make the transistor characteristics of the outer thin film transistor positioned in the outer region EA weaker (or less desirable) so as to reduce or minimize the difference in the transistor characteristics between the plurality of thin film transistors which are positioned over the display area D1A of the substrate SUB, thereby reducing or minimizing the difference in the luminance among the plurality of organic light emitting diodes (OLED) connected to the plurality of thin film transistors. As a result, it is possible to provide the organic light emitting diode display in which the display quality deterioration of the image is reduced or minimized.

The embodiments of the present invention are to provide the organic light emitting diode display having aspects for suppressing the difference among the current values supplied to the plurality of organic light emitting diodes OLED from occurring over the substrate SUB even though the difference among the widths of the active layers of the plurality of thin film transistors, respectively, unexpectedly occurs over the substrate SUB.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. An organic light emitting diode display, comprising:
    a substrate comprising a display area and a non-display area adjacent the display area;
    a plurality of pixels, each comprising:
        an organic light emitting diode at the display area of the substrate; and
        a plurality of thin film transistors at the display area of the substrate, respective ones of the plurality of thin film transistors being connected to the organic light emitting diode; and
    a first insulating layer covering an active layer of the plurality of thin film transistors of each of the pixels, the first insulating layer having a greater number of contact holes corresponding to ones of the pixels at an outer region of the display area than corresponding to others of the pixels at a central area of the display area.

2. The organic light emitting diode display of claim 1, wherein
    the first insulating layer contacts the active layer.
3. The organic light emitting diode display of claim 1, wherein the contact holes corresponding to ones of the pixels at an outer region include at least one dummy contact hole.
4. The organic light emitting diode display of claim 3, wherein
    the dummy contact hole overlaps the active layer.
5. The organic light emitting diode display of claim 3, wherein
    the dummy contact hole does not overlap the active layer.
6. The organic light emitting diode display of claim 3, further comprising a second insulating layer covering the first insulating layer,
    wherein the second insulating layer is inside of the dummy contact hole.
7. The organic light emitting diode display of claim 1, further comprising:
    a plurality of data lines extending in one direction on the substrate and connected to the plurality of thin film transistors; and
    a data driver at the non-display area of the substrate and connected to the plurality of data lines,
    wherein the outer region is adjacent the data driver.
8. The organic light emitting diode display of claim 1, wherein
    the active layer is heat treated in a state in which the active layer is covered with the first insulating layer.
9. The organic light emitting diode display of claim 1, wherein the active layer comprises a channel region, the channel region being bent at least once.
10. An organic light emitting diode display, comprising:
    a substrate comprising a display area and a non-display area adjacent the display area;
    a plurality of organic light emitting diodes at the display area of the substrate;
    a plurality of thin film transistors at the display area of the substrate, each of the plurality of thin film transistors being connected to a corresponding one of the plurality of organic light emitting diodes; and
    a first insulating layer covering an active layer of the plurality of thin film transistors, the first insulating layer having a greater number of contact holes at an outer region of the display area than at a central area of the display area,
    wherein the plurality of thin film transistors comprises a central thin film transistor at a central area of the display area and an outer thin film transistor at an outer region of the display area, and
    wherein a width of the active layer of the outer thin film transistor is greater than a width of the active layer of the central thin film transistor.

* * * * *